(12) United States Patent
Tokuda et al.

(10) Patent No.: US 12,171,082 B2
(45) Date of Patent: Dec. 17, 2024

(54) IMMERSION COOLING APPARATUS

(71) Applicant: NEC Corporation, Tokyo (JP)

(72) Inventors: Atsuki Tokuda, Tokyo (JP); Norihiko Mochida, Tokyo (JP)

(73) Assignee: NEC CORPORATION, Tokyo (JP)

( * ) Notice: Subject to any disclaimer, the term of this patent is extended or adjusted under 35 U.S.C. 154(b) by 210 days.

(21) Appl. No.: 17/748,207

(22) Filed: May 19, 2022

(65) Prior Publication Data

US 2023/0292460 A1    Sep. 14, 2023

(30) Foreign Application Priority Data

Mar. 10, 2022    (JP) ................................ 2022-037302

(51) Int. Cl.
*H05K 7/20* (2006.01)

(52) U.S. Cl.
CPC ..... *H05K 7/20236* (2013.01); *H05K 7/20272* (2013.01)

(58) Field of Classification Search
CPC ........... H05K 7/20236; H05K 7/20272; H05K 7/20218; H05K 7/14; H05K 7/1401; H05K 7/1402; H05K 7/1404; H05K 7/1405; H05K 7/1407; H05K 7/1408; H05K 7/1409; H05K 7/1417; H05K 7/1418; H05K 5/03; H05K 5/04; H05K 5/06; H05K 5/067; H05K 5/061
See application file for complete search history.

(56) References Cited

U.S. PATENT DOCUMENTS

| | | | | |
|---|---|---|---|---|
| 3,909,678 A | * | 9/1975 | Rifkin | H01L 23/44 174/15.1 |
| 4,700,272 A | * | 10/1987 | Bellamy | H05K 7/20636 174/12 R |
| 4,730,665 A | * | 3/1988 | Cutchaw | H01L 23/473 257/E23.09 |
| 6,304,447 B1 | * | 10/2001 | Bortolini | H05K 7/20236 257/714 |

(Continued)

FOREIGN PATENT DOCUMENTS

| EP | 2928275 A1 | 10/2015 |
|---|---|---|
| JP | H07-025395 A | 1/1995 |

(Continued)

OTHER PUBLICATIONS

Extended European Search Report for EP Application No. EP22175962.4 dated on Nov. 16, 2022.

*Primary Examiner* — Jacob R Crum
*Assistant Examiner* — Matthew Sinclair Muir

(57) ABSTRACT

An immersion cooling apparatus includes a pressure vessel including a vessel body and at least one lid. The at least one lid is detachably joined to the vessel body, wherein a certain lid of the at least one lid has a coolant outlet and a coolant inlet. The pressure vessel is filled with liquid coolant. A mounting member places the circuit board at a position between the coolant outlet and the coolant inlet within the pressure vessel. The circuit board is immersed in the liquid coolant within the pressure vessel such the circuit board is surrounded with the liquid coolant. The liquid coolant forcedly flows from one side of the circuit board to outside through the coolant outlet and forcedly flows into the other side of the circuit board from outside through the coolant inlet.

11 Claims, 11 Drawing Sheets

FIRST EXEMPLARY EMBODIMENT

(56) References Cited

U.S. PATENT DOCUMENTS

| | | | |
|---|---|---|---|
| 9,392,727 B2 * | 7/2016 | Chester | H05K 13/00 |
| 9,750,159 B2 | 8/2017 | Campbell et al. | |
| 10,165,707 B1 * | 12/2018 | Christiansen | H05K 7/20872 |
| 10,204,659 B1 * | 2/2019 | Keehn | G11B 33/124 |
| 11,058,029 B2 * | 7/2021 | Saito | H05K 7/20763 |
| 11,343,944 B2 * | 5/2022 | White | H05K 7/20445 |
| 2012/0314373 A1 * | 12/2012 | Park | H05K 7/1434 |
| | | | 361/715 |
| 2015/0354902 A1 * | 12/2015 | McDonald | H05K 7/14337 |
| | | | 165/45 |
| 2016/0257433 A1 | 9/2016 | Wallinger | |
| 2018/0027695 A1 | 1/2018 | Wakino et al. | |
| 2018/0153059 A1 | 5/2018 | Dehlsen et al. | |
| 2018/0199465 A1 | 7/2018 | Metzler et al. | |
| 2019/0219311 A1 | 7/2019 | Smith | |

FOREIGN PATENT DOCUMENTS

| | | |
|---|---|---|
| JP | 2002-166899 A | 6/2002 |
| JP | 6720752 B | 7/2020 |
| SE | 1400472 A1 | 10/2014 |

* cited by examiner

IMMERSION COOLING APPARATUS

INCORPORATION BY REFERENCE

This application is based upon and claims the benefit of priority from Japanese Patent Application No. 2022-037302, filed on Mar. 10, 2022, the disclosure of which is incorporated herein in its entirety by reference.

BACKGROUND OF THE INVENTION

The present application relates to techniques for cooling electronic equipment that generates heat.

Recent electronic equipment includes a lot of semiconductor circuits, and in particular, integrated circuits such as central processing units (CPUs) or processors are essential electronic components for performing various controls of electronic devices. Usually, consumer-oriented electronic components are not designed for use in harsh environments. Accordingly, ruggedizing techniques are indispensable in the case where the electronic equipment is expected to be used in environments outside normal ranges of temperature, pressure, vibration, etc.

As an example of a ruggedizing technique, JP2002-166899 (hereinafter, referred to as Patent document 1) discloses a space-environment ruggedizing container for protecting consumer electronic components from cosmic rays. This space-environment ruggedizing container is made of aluminum 3 millimeters in thickness, aiming to reduce weight and reliably shield cosmic rays (mainly electrons and protons).

On the other hand, many electronic components include semiconductor circuits (e.g., processors) that generate heat during operation. In the case where such heat-generating electronic components are sealed within a container, it is necessary to provide a means of dissipating heat to outside. For example, electronic equipment mounted on a artificial satellite includes circuit boards containing integrated circuits that perform high-speed calculations with high heat generation. Accordingly, not only ruggedizing but also cooling is an indispensable technique.

The above-mentioned Patent Document 1 discloses a structure in which a cooling plate is provided on the bottom plate of a container to conduct heat generated by electronic components to the outside for heat exhaustion. Also, JP H07-025395 (hereinafter, referred to as Patent document 2) discloses a heat dissipation device that improves heat dissipation efficiency. More specifically, a heat pipe mounted on the heat-generating part of an onboard device of a satellite is joined to a heat pipe mounted on the heat dissipation part outside the heat-generating part.

In recent years, immersion cooling, in which the electronic device itself is immersed in a coolant bath, has attracted attention as a method for cooling electronic devices such as computers. For example, in JP Patent No. 6720752 (hereinafter, referred to as Patent document 3), an electronic device is immersed in a coolant bath filled with a first coolant. In addition, a liquid cooling jacket is provided to cool the electronic device by flowing a second coolant from the outside into the liquid cooling jacket. A liquid flow generator is provided in the coolant bath to flow the first coolant in the coolant bath for enhanced cooling efficiency. U.S. Pat. No. 9,750,159B2 (hereinafter, referred to as Patent document 4) also discloses a liquid immersion cooling device that flows a coolant by means of a pump, and describes an example of efficiently dissipating heat from electronic components by convection and boiling of the coolant.

LIST OF RELATED-ART DOCUMENTS

[Patent document 1] JP2002-166899;
[Patent document 2] JP H07-025395;
[Patent document 3] JP Patent No. 6720752; and
[Patent document 4] U.S. Pat. No. 9,750,159B2.

SUMMARY OF THE INVENTION

According to the heat dissipation methods disclosed in Patent documents 1 and 2, it is difficult to achieve high dissipation efficiency of heat because the heat from integrated circuits is dissipated by means of thermal conduction through multiple components.

According to the immersion cooling devices described in Patent documents 3 and 4, different coolant flowing means are required: a means of flowing a first coolant in which the electronic equipment is immersed; and another means of flowing a second coolant for cooling that first coolant, which results in complicated structure and manufacturing process.

The immersion cooling devices described in Patent documents 3 and 4 employ a cooling system designed for normal use on the ground. In other words, they are not designed for use in harsh environment such as zero-gravity environment and extreme conditions of substantial vibrations when launched by a rocket. Therefore, when such an immersion cooling device is mounted on a spacecraft as it is, the convection of the coolant does not occur in weightless space, and bubbles due to boiling do not remove from heat dissipation fins, causing dry-out phenomenon.

An object of the present invention is to provide an immersion cooling device which allows enhanced resistance to harsh environment, increased cooling efficiency, and easy design and manufacturing.

According to an embodiment of the present invention, an immersion cooling apparatus for a circuit board including a heat-generating section, includes: a pressure vessel including a vessel body and at least one lid, wherein the at least one lid is detachably joined to the vessel body, wherein a certain lid of the at least one lid has a coolant outlet and a coolant inlet, wherein the pressure vessel is filled with liquid coolant; and a mounting member that places the circuit board at a position between the coolant outlet and the coolant inlet within the pressure vessel, wherein the circuit board is immersed in the liquid coolant within the pressure vessel such the circuit board is surrounded with the liquid coolant, wherein the liquid coolant forcedly flows from one side of the circuit board to outside the pressure vessel through the coolant outlet and forcedly flows into the other side of the circuit board from outside the pressure vessel through the coolant inlet.

According to the invention, the circuit board is immersed in the liquid coolant and securely placed in the pressure vessel with the liquid coolant forcedly flowing along the circuit board. This enhances resistance to harsh environments and improves cooling efficiency. Further the coolant outlet and coolant inlet are provided on one lid of the pressure vessel, resulting in simplified design and manufacturing.

DETAILED DESCRIPTION

<Outline of Exemplary Embodiments>

Figure 1:
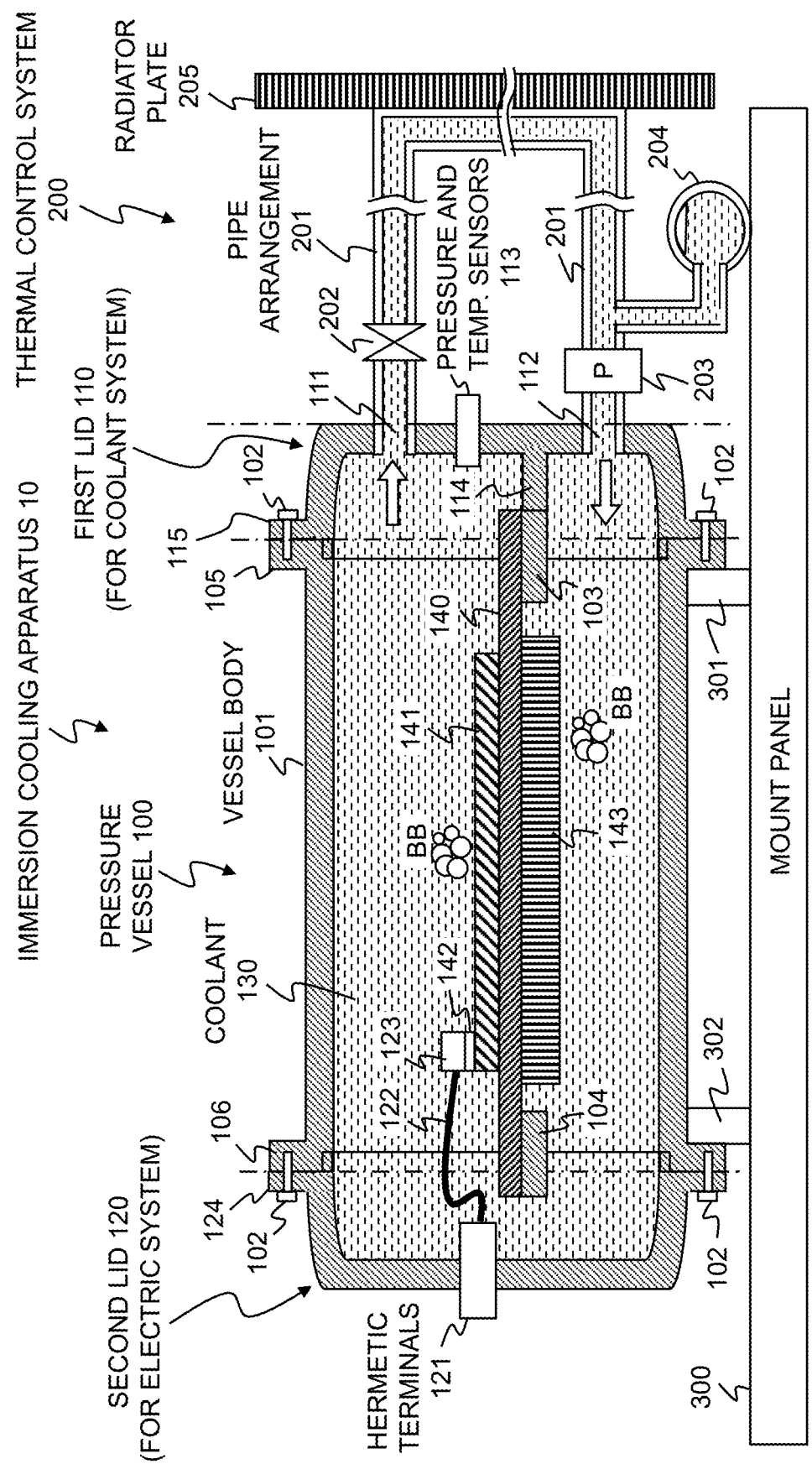
FIG. 1 illustrates a schematic side cross-sectional view of an immersion cooling apparatus according to a first exemplary embodiment of the present invention.

According to an embodiment of the present invention, a pressure vessel composed of at least one detachable lid and a vessel body is filled with a coolant, and a circuit board is placed and immersed in the coolant within the pressure vessel. One lid has a coolant inlet and a coolant outlet, through which the coolant is forced to circulate. Furthermore, both ends of the circuit board are secured by mounting members provided in the vessel body.

The coolant flows into the pressure vessel from the coolant inlet by means of a forced-liquid flow generator installed outside the pressure vessel. The coolant flows into the pressure vessel through the coolant inlet, flows over the front and back surfaces of the circuit board, and flows out through the coolant outlet. More specifically, the coolant inlet and the coolant outlet are provided in the same lid, and the coolant flows in through the coolant inlet, flows on one side of the circuit board, flows along the inner surface of the pressure vessel to the other side of the circuit board, and flows out through the coolant outlet. Accordingly, the space around the circuit board is filled with flowing coolant, allowing efficient cooling. In addition, the circuit board is immersed in the coolant and surrounded by the pressure vessel, and both ends of the circuit board are secured by mounting members within the pressure vessel, allowing enhanced resistance to harsh environment. In particular, the circuit board has excellent resistance to harsh environments such as extremely cold/hot regions and the outer space, as well as environments subjected to substantial vibrations during rocket launches or the like.

In an assembly process, the electronic circuit board can be easily installed in the pressure vessel by simply detaching the lid from the vessel body, placing the electronic circuit board in the vessel body, and then joining the lid and the vessel body. Preferably, the pressure vessel is divided into three sections: the vessel body having openings on both opposite surfaces; and a pair of lids each covering the openings of the vessel body. One of the lids is provided with the coolant inlet and the coolant outlet, and the other is provided with electrical terminals. By employing such division structure, the mechanical design of the pressure vessel, the design of the electrical system including the electronic circuit board and electrical terminals, and the design of coolant thermal control system can be separated, allowing improved design efficiency.

Furthermore, according to the exemplary embodiment, the coolant inlet and the coolant outlet are provided on one lid, allowing the thermal control system including the heat dissipation mechanism and the forced-liquid flow generator such as a pump to be arranged on the side of the one lid. As a result, the coolant that flows out through the coolant outlet of the pressure vessel is cooled by the thermal control system and then returned to the pressure vessel through the coolant inlet, to form a circulation system. Since the coolant on the electronic circuit board is forced to flow by the forced-liquid flow generator, the heat generated on the electronic circuit board can be dissipated to outside, thereby efficiently cooling the electronic circuit board. Accordingly, t the dry-out phenomenon can be prevented from occurring on the electronic circuit even in a space where gravity can be ignored.

Exemplary embodiments of the present invention will be described in detail below with reference to the drawings. It should be noted that the components, their shapes, dimensions and dimension ratios, and arrangements described in the following embodiments are just examples for explaining the embodiments and are not intended to limit the technical scope of the invention to them.

1. First Exemplary Embodiment 1.1) Structure

As illustrated in FIGS. 1 to 4, an immersion cooling apparatus 10 according to a first embodiment of the present invention comprises a pressure vessel 100 and a thermal control system 200. The pressure vessel 100 comprises a cylindrical vessel body 101 and first and second lids 110 and 120. The first and second lids 110 and 120 are detachably connected to opposing opening surfaces of the vessel body 101, respectively. The pressure vessel 100 seals in coolant 130. The first lid 110 and the second lid 120 are hermetically joined to the opening surfaces on both sides of the vessel body 101 by a plurality of bolts 102 or other joining members. Here, it is assumed that the first lid 110 is used for the coolant system and the second lid 120 for the electrical system.

The vessel body 101 is provided with a mounting member composed of mounting flanges 103 and 104, which are centrally provided at both ends of the vessel body 101. The mounting flanges 103 and 104 are used to secure a plate 140 as described below. The vessel body 101 has flanges 105 and 106 protruding outward from both opening ends of the vessel body 101. These flanges 105 and 106 are used to join the first lid 110 and the second lid 120 to the vessel body 101.

The first lid 110 has a coolant outlet 111 and a coolant inlet 112. The coolant 130 flows out through the coolant outlet 111. Coolant 130 that has been temperature-controlled by the thermal control system 200 flows in through the coolant inlet 112. Furthermore, sensors 113 for detecting the pressure and temperature in the pressure vessel 100 are provided at a position closer to the coolant outlet 111 between the coolant outlet 111 and the coolant inlet 112. The first lid 110 also has a flange 114 protruding inward at a position between the pressure and temperature sensors 113 and the coolant inlet 112 such that the flange 114 comes into contact with the mounting flange 103 of the vessel body 101. The flange 114 and the mounting flange 103 are combined to form a partition wall that partitions the inside of the pressure vessel 100 on the side of the first lid 110 vertically (in the top-and-bottom direction of FIG. 1) as shown in FIGS. 1 and 3. Accordingly, the flange 114 and the mounting flange 103 as the partition wall prevents the coolant 130 from directly flowing from the coolant inlet 112 to the pressure and temperature sensors 113 and the coolant outlet 111. The first lid 110 has a flange 115 protruding outward from the opening end of the first lid 110. The flange 115 is used to join the first lid 110 to the flange 105 of the vessel body 101 by joining members 102 (see FIG. 2).

The second lid 120 has hermetic terminals 121 at the approximately central portion of the second lid 120. The hermetic terminals 121 are electrical terminals for sending and receiving signals to and from the outside and for receiving power supply. The hermetic terminals 121 are connected to a connector 123 through a cable 122 in the coolant 103 and the connector 123 is connected to a connector 142 mounted on a circuit board 141. The second lid 120 has a flange 124 protruding outward from the opening end of the second lid 120. The flange 124 is used to join the second lid 120 to the flange 106 of the vessel body 101 by joining members 102 (see FIG. 2).

Inside the pressure vessel 100, the plate 140 is supported and secured at both ends thereof by the mounting flanges 103 and 104. The circuit board 141 is fixed to the surface of the plate 140 on the side of the coolant outlet 111. Heat-dissipating fins 143 are fixed to the surface of the plate 140 on the side of the coolant inlet 112. A connector 142 is provided at the end of the circuit board 141 on the side of the second lid 120. As described above, the connector 142 is connected to the hermetic terminals 121 through the connector 123 and the cable 122, allowing signal transmission and power supply between the circuit board 141 and the outside.

The thermal control system 200 includes a pipe arrangement connecting the coolant outlet 111 and the coolant inlet 112; a valve 202 provided near the coolant outlet 111; a pump 203 which is a forced-liquid flow generator located near the coolant inlet 112; an accumulator 204 with heating means; and a radiator plate 205 coupled to the pipe arrangement 201 by radiation. The pump 203 drives the coolant 13 in the pressure vessel 100 to flow from the coolant outlet 111 to the valve 202 and the pipe arrangement 201. The heat of the coolant flowing through the pipe arrangement 201 is dissipated into outside by the radiator plate 205. (see FIG. 1).

The pump 203 drives the coolant thus cooled to flow into the pressure vessel 100 through the coolant inlet 112. The cooled coolant flows over the heat-dissipating fins 143 and the circuit board 141 to cool them. Even if heat of the heat-dissipating fins 143 and the circuit board 141 causes coolant 130 to vaporize to generate bubbles BB, the pump 203 forcedly flows the bubbles BB flow together with the coolant 130 and then the bubbles BB condense near the inner wall of the pressure vessel 100. In this way, the coolant 130 circulates through the interior of the pressure vessel 100 and the pipe arrangement 201 of the thermal control system 200 between the coolant outlet 111 and the coolant inlet 112. The accumulator 204 is a vessel which is equipped with a heater inside and temporarily stores gas/liquid. Accordingly, the heater in the accumulator 204 can be controlled to adjust the pressure and temperature of the coolant 130 to a state suitable for phase change (vaporization and condensation).

Figure 2:
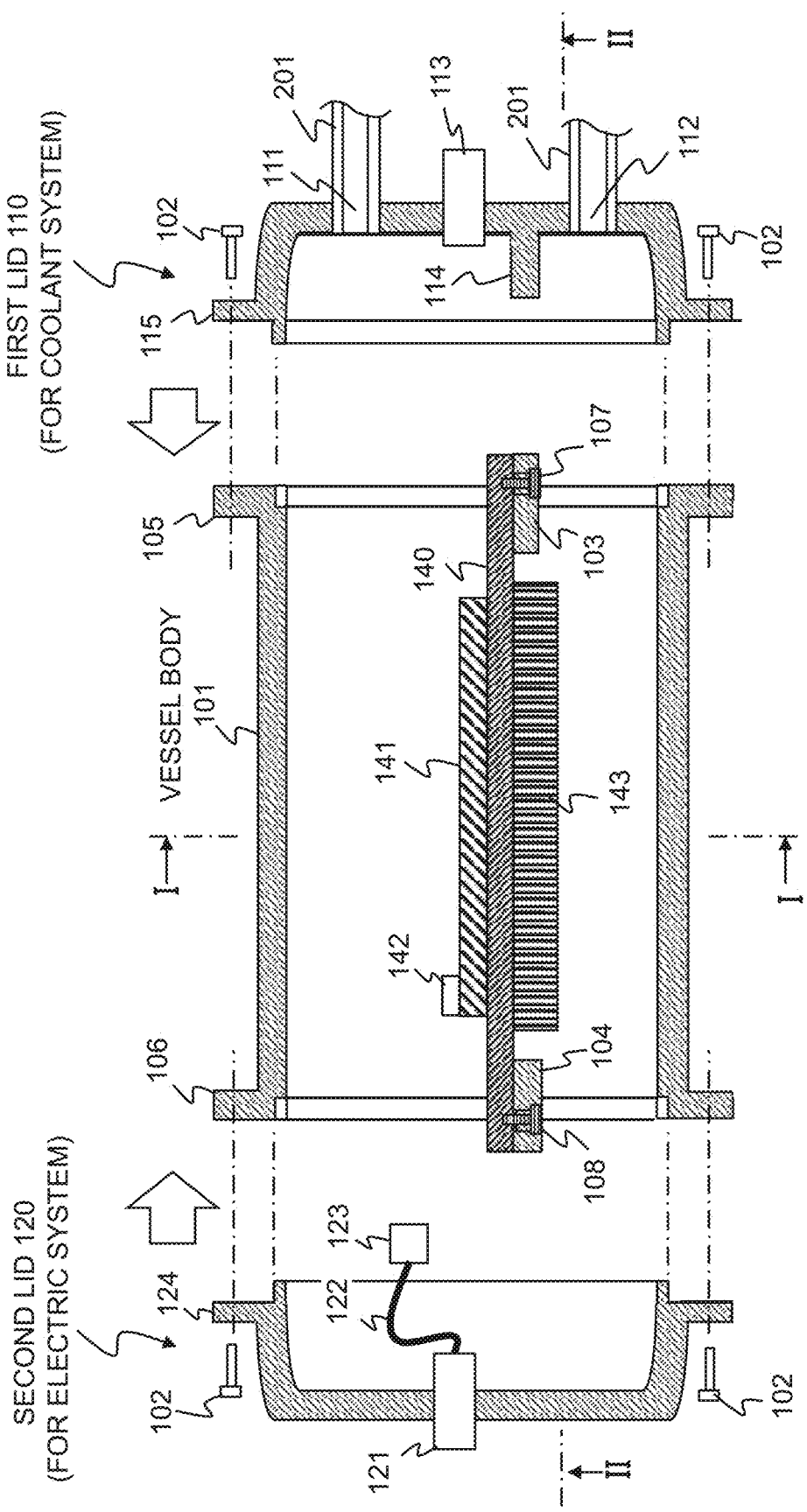
FIG. 2 illustrates an exploded side sectional view of a pressure vessel of the immersion cooling apparatus according to the first embodiment.
Figure 3:
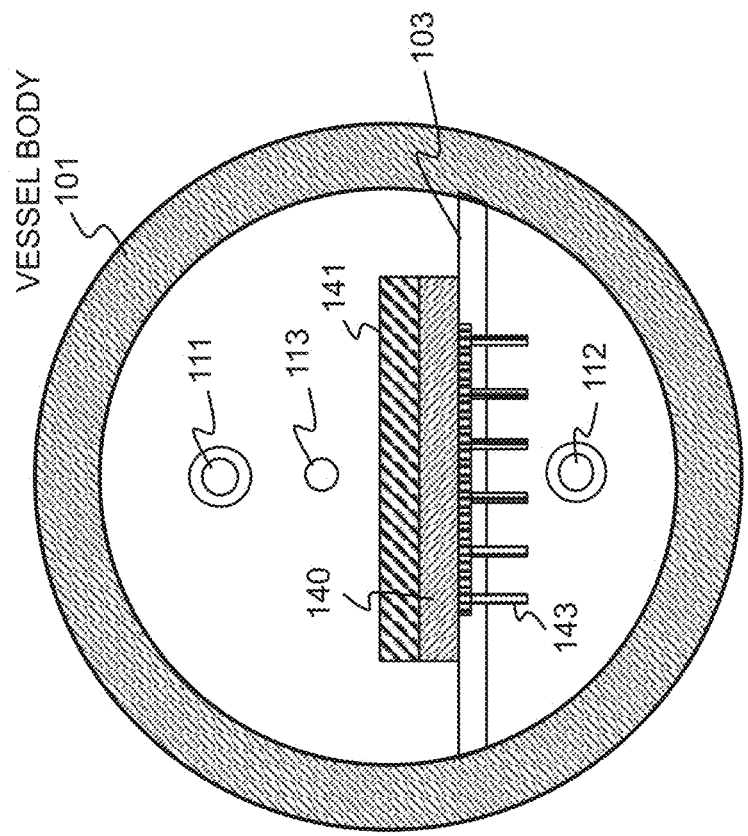
FIG. 3 illustrates a cross-sectional view taken along lines I-I of FIG. 2.
Figure 4:
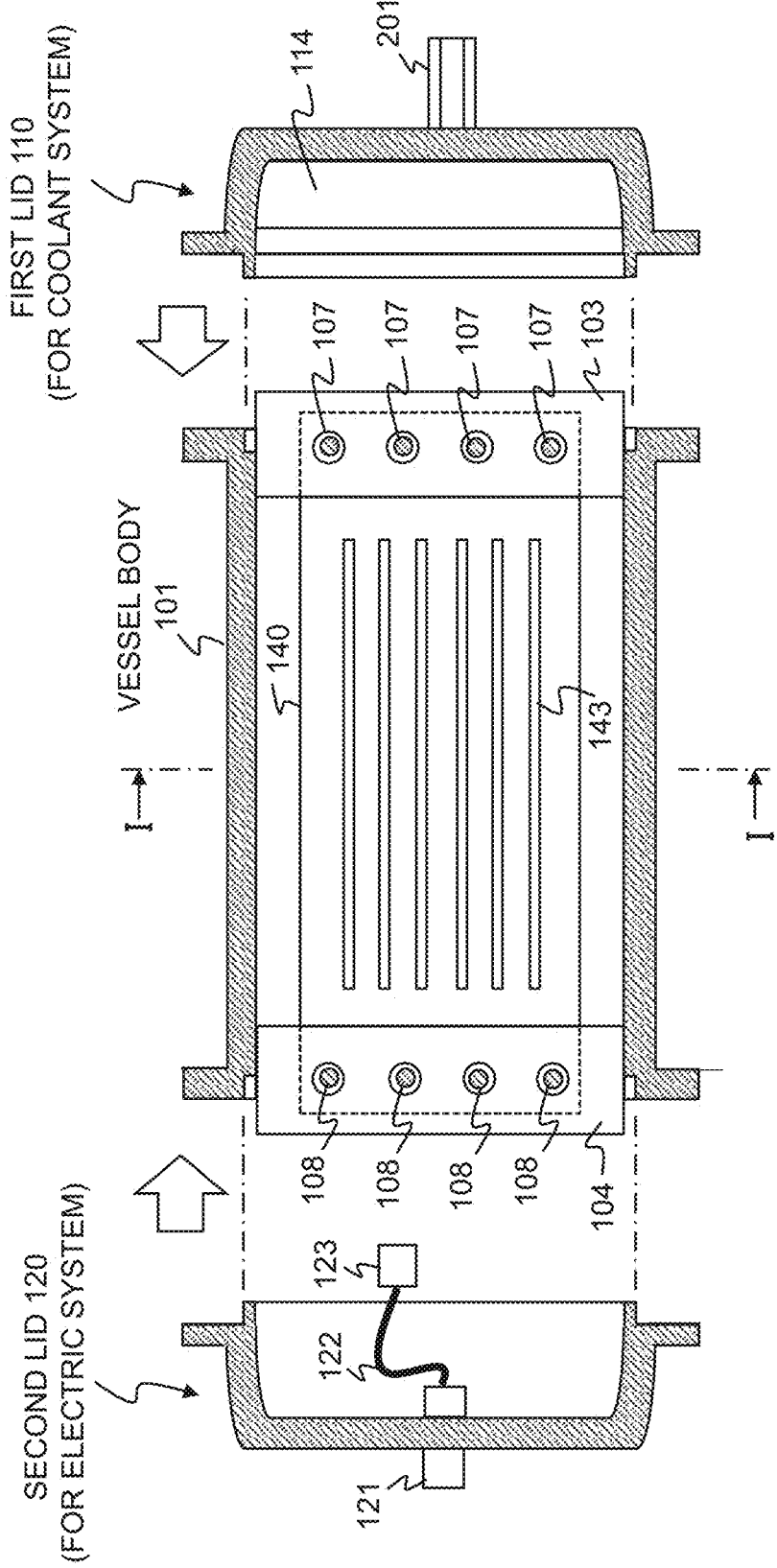
FIG. 4 illustrates a cross-sectional view taken along lines II-II lines of FIG. 2.

As illustrated in FIG. 2, the plate 140 mounted with the circuit board 141 and the heat-dissipating fins 143 is fixed on the mounting flanges 103 and 104 of the vessel body 101 by tap bolts 107 and 108. As illustrated in FIG. 4, the mounting flanges 103 and 104 have clearance holes through which the tap bolts 107 and 108 pass, allowing for visual inspection when tightening the tap bolts 107 and 108 to mount the plate 140 to the mounting flanges 103 and 104, and facilitating work when attaching the tap bolts 107 and 108. In this manner, the circuit board 141 on the plate 140 is fixed and placed in the near central portion of the vessel body 101.

As illustrated in FIG. 1, the pressure vessel 100 and thermal control system 200 described above are fixed to a mount panel 300 of a satellite or the like by supporting legs 301 and 302. The pipe arrangement 201, the pump 203, the accumulator 204 and the radiator plate 205 of the thermal control system 200 are also supported and secured to the mount panel 300 by support members (not shown) to prevent them from coming off due to vibrations or the like.

Figure 5:
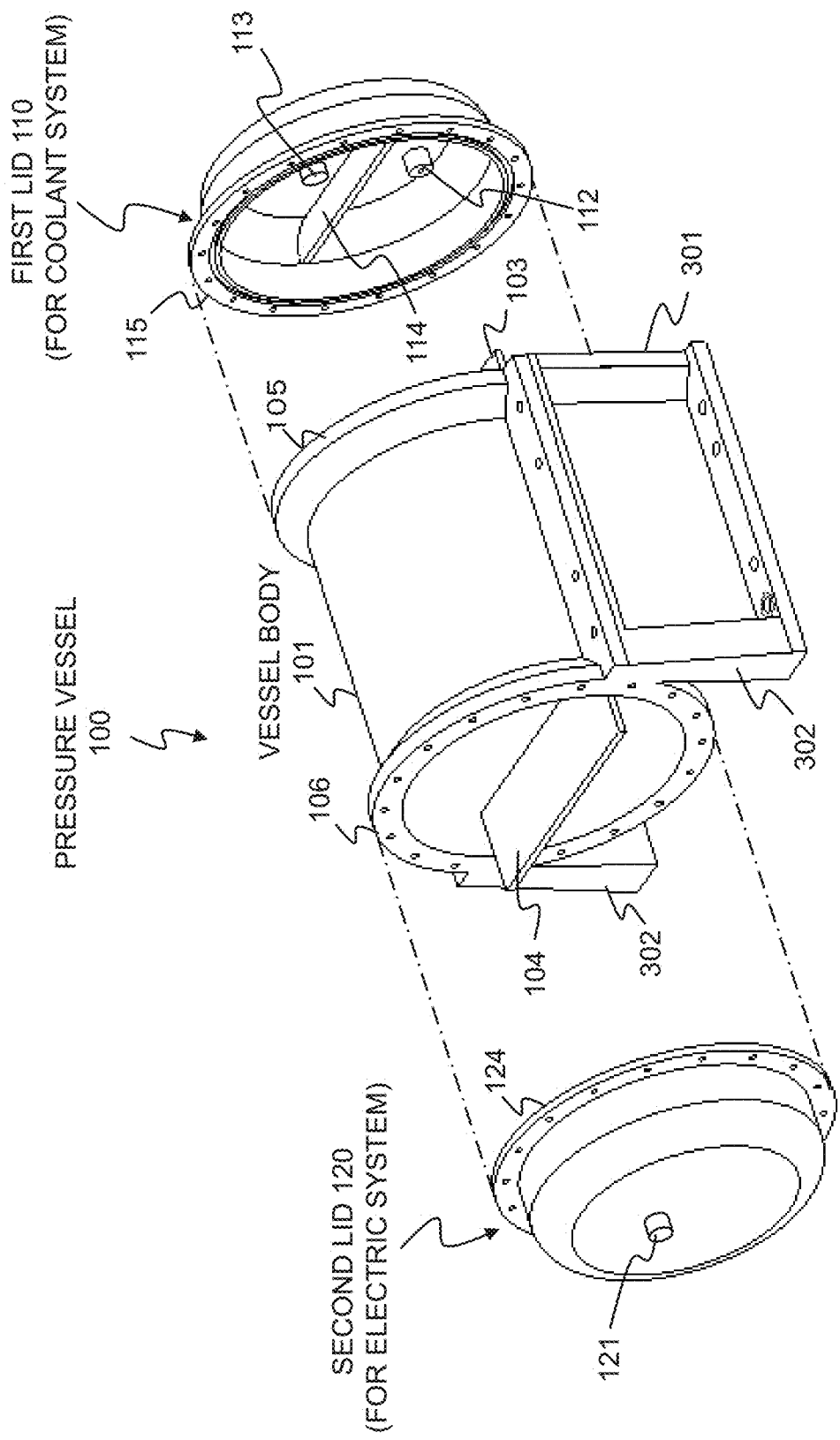
FIG. 5 illustrates an exploded perspective view of an example of a pressure vessel of the immersion cooling apparatus according to the first embodiment.

FIG. 5 illustrates an appearance of the pressure vessel 100 more specifically. In FIG. 5, the similar components as in FIGS. 1-4 are labeled with the same reference numbers.

Figure 6:
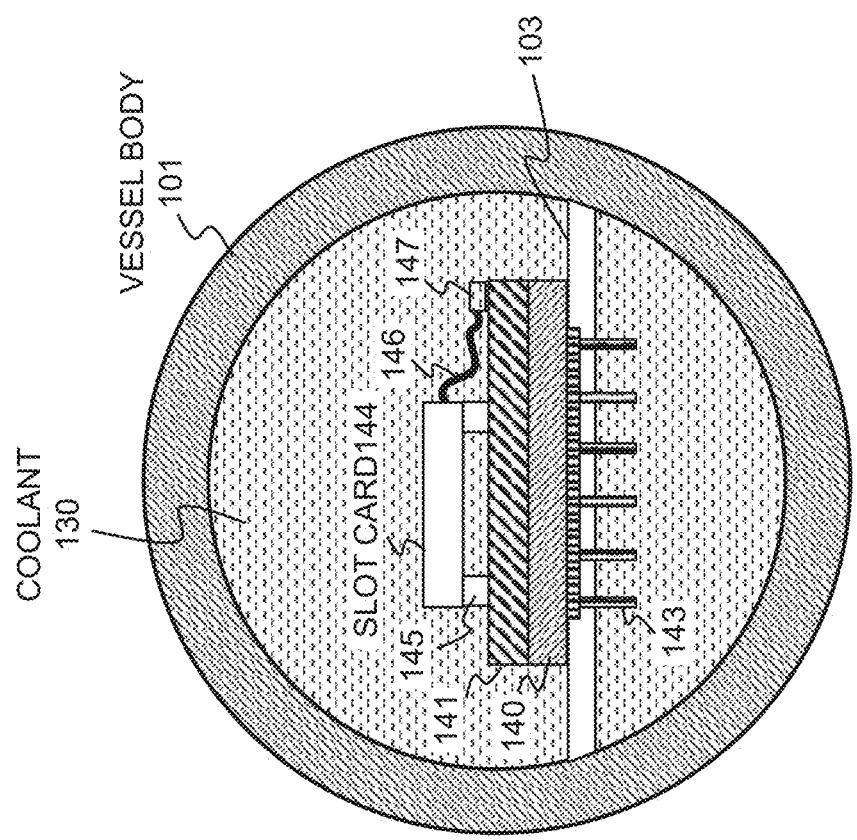
FIG. 6 illustrates a schematic cross-sectional view of an example of a pressure vessel mounted with a slot card in the immersion cooling apparatus according to the first embodiment.

As illustrated in FIG. 6, a slot card 144 can be mounted on the circuit board 141 with spacers 145 such that the slot card 144 is connected to the circuit board 141 through an immersion-dedicated cable 146 and a connector 147. Since the slot card 144 is mounted parallel to the circuit board 141 as shown in FIG. 6, the performance of a processor and other devices can be expanded without increasing the diameter of the vessel body 101. In addition, cooling efficiency can be maintained because the flow of coolant 130 is not impeded.

Also, by using the immersion-dedicated cable 146, the circuit board 141 and expansion slot cards can be arranged flexibly in the pressure vessel 100. More specifically, although expansion slot cards are usually mounted perpendicular to the circuit board, it is possible to mount the expansion slot cards parallel to the circuit board 141, allowing the pressure vessel 100 to be downsized without unnecessarily widening its diameter.

1.2) Example of Implementation

Figure 7:
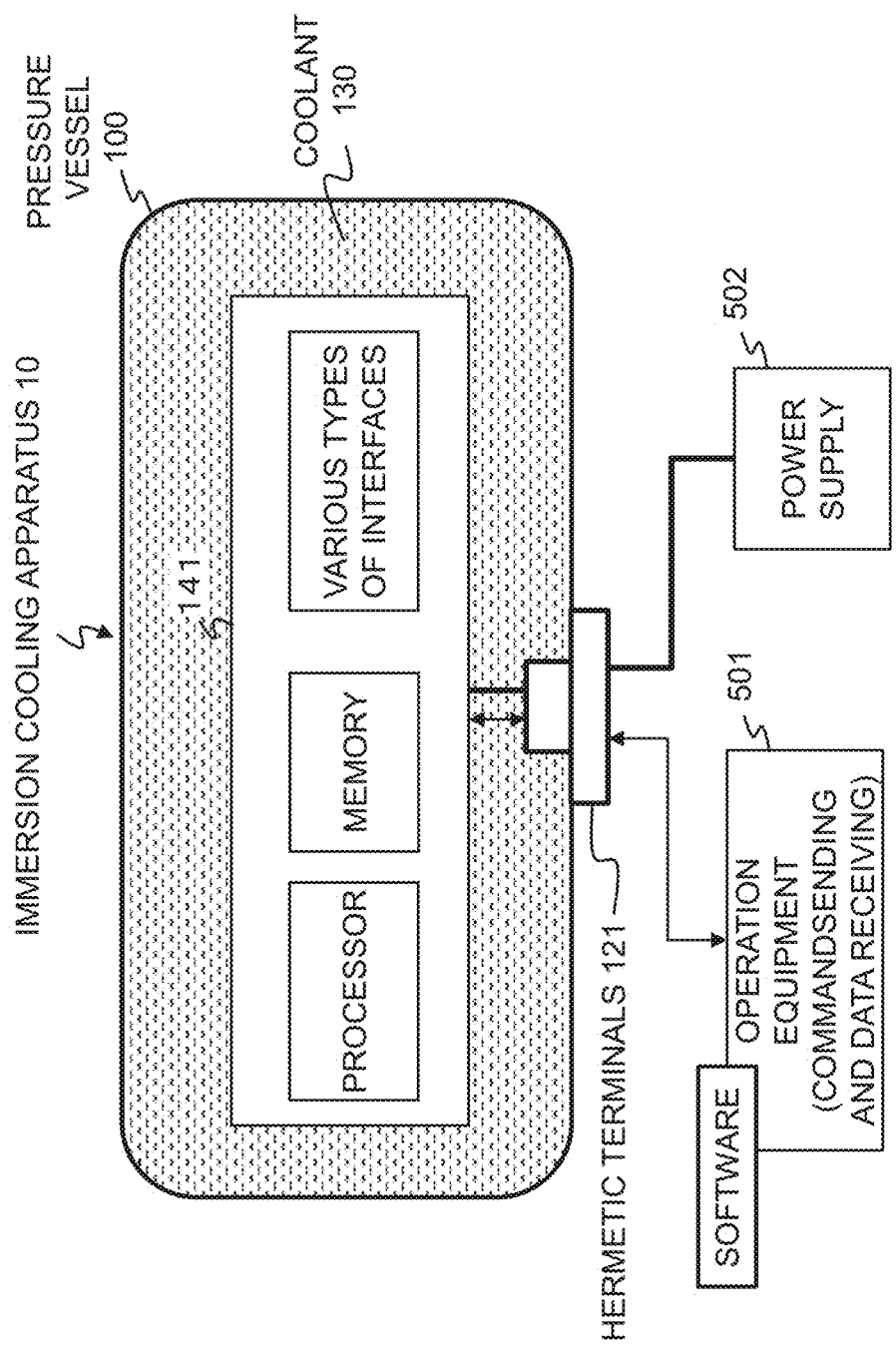
FIG. 7 illustrates a schematic block diagram of connection between the circuit board within the pressure vessel and the external electrical system in the immersion cooling apparatus according to the first embodiment.

As illustrated in FIG. 7, the processor and other components on the circuit board 141 are connected to operation equipment 501 and a power supply 502 provided outside the pressure vessel 100 through the hermetic terminals 121. The operation equipment 501 can send commands to operate the circuit board 141 by software and receive response data accordingly. The power supply 502 supplies power to the circuit board 141.

Figure 8:
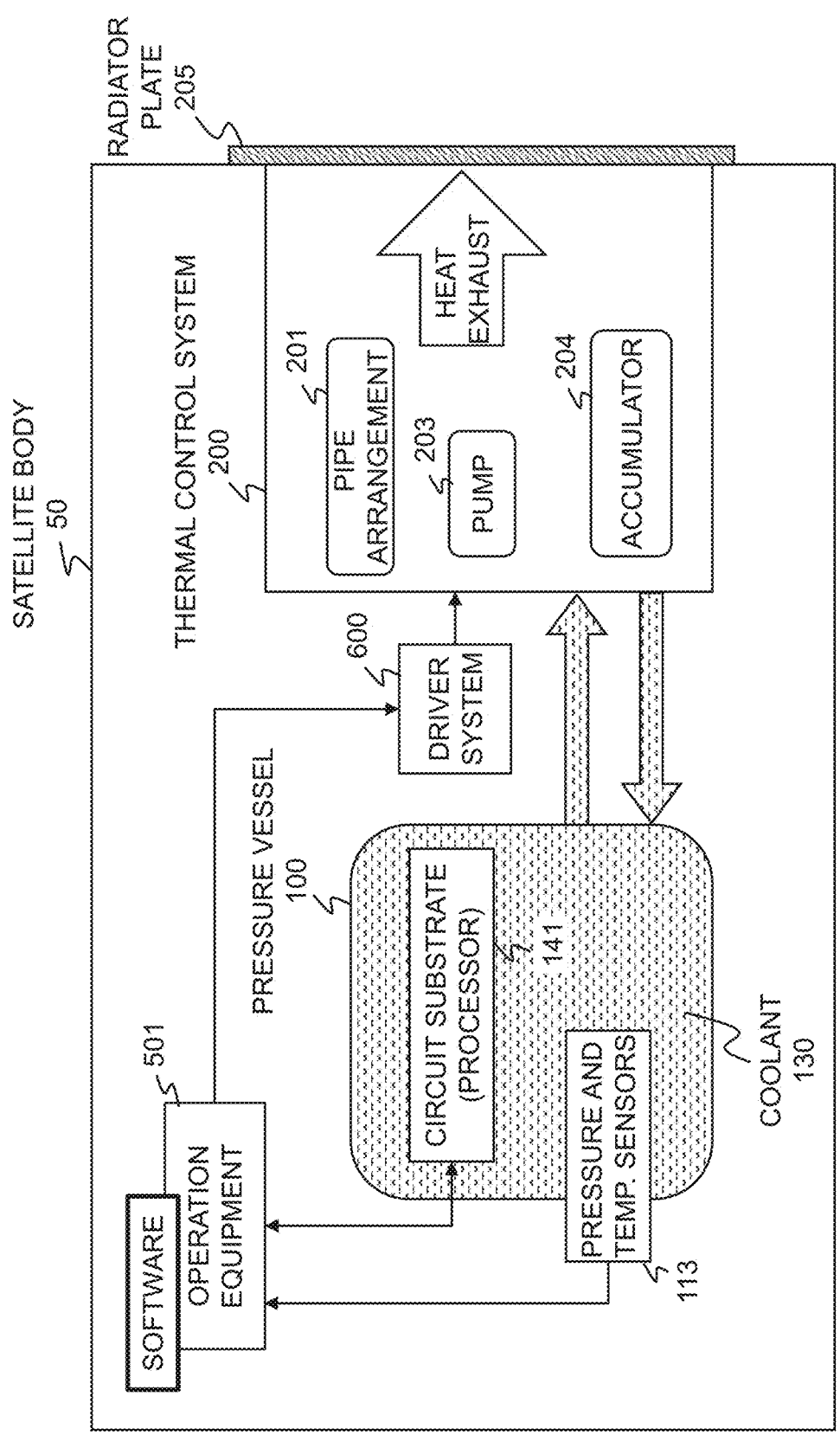
FIG. 8 illustrates a schematic block diagram for explaining the overall configuration and operation of the immersion cooling apparatus according to the first embodiment.

Referring to FIG. 8, the functional configuration of the immersion cooling apparatus 10 will be described, assuming that the immersion cooling apparatus 10 is mounted on a satellite which is an example of a space vehicle. Here, it is also assumed that the driver system 600 controls the pump 203 and the accumulator 204 of the thermal control system 20 under the control of the circuit board 141.

In FIG. 8, the operation equipment 501 inputs the pressure of the pressure vessel 100 and the temperature of the coolant from the pressure and temperature sensors 113 and sends operating commands including the pressure and temperature data to the circuit board 141. The processor on the circuit board 141 sends control data of the driver system 600 to the driver system 600 through the operation equipment 501 according to the pressure and temperature data to adjust the pressure of the pressure vessel 100 and the temperature of the coolant. More specifically, while monitoring the detection data from the pressure and temperature sensors 113, the pump 203 is driven and the heater temperature of the accumulator 204 is adjusted to control the temperature of the coolant 130 to a temperature suitable for phase change (vaporization and condensation).

The coolant 130 should be an electrically insulating and thermally conductive liquid, preferably containing hydrogen atoms for neutron beam moderation and shielding. For example, a liquid such as CFC (chlorofluorocarbons)-replacing material or polyester can be used as such coolant 130. In the present embodiment, when the temperature of the entire pressure vessel 100 is controlled at 60° C. or lower, the boiling point of the coolant 130 is about 76° C.

1.3) Advantageous Effects

As described above, according to the first exemplary embodiment, the circuit board 141 is immersed in the coolant 130 flowing through the pressure vessel 100, which allows for efficient cooling. The circuit board 141 is surrounded by the pressure vessel 100 and the coolant 130, enhancing the resistance to substantial vibrations and harsh environments such as the outer space.

According to the present exemplary embodiment, the pressure vessel 100 can be divided into three sections: the vessel body 101; the first lid (for coolant system); and the second lid (for electrical systems). Since one of the first and second lids is used for the coolant system and the other for the electrical system, the design of the mechanical structure of the pressure vessel 100, the design of the thermal control system, and the design of the electrical system can be divided respectively, making it easier to derive the optimal solution for the immersion cooling apparatus 10. Specifically, it is possible to divide the design of the immersion cooling apparatus 10 into three sections as follows: the mechanical design section responsible for the entire pressure vessel 100 and each mechanical joint; the thermal control design section responsible for installation of the pipe arrangement 201, the pump 203 and the accumulator 204; and the electrical design section responsible for the hermetic terminals 121 on the side of the second lid 120 and the circuit board 141.

For the support rigidity of the circuit board 141 mounted in the pressure vessel 100, the vessel body 101 is provided with the mounting flanges 103 and 104 on both sides of the vessel body 101, respectively. The mounting flanges 103 and 104 are dedicated for supporting the circuit board 141. The plate 140 mounted with the circuit board 141 is fixed on the mounting flanges 103 and 104 at both ends of the plate 140. This ensures the support rigidity that meets resistance requirements to substantial vibrations such as during rocket launches.

In the present exemplary embodiment, the first lid 110 for the coolant system and the second lid 120 for the electrical system are provided on both sides of the vessel body 101. However, the present embodiment is not limited to such a structure. If mounting is not difficult, the first lid 110 and the second lid 120 may be placed adjacent to each other.

2. Second Exemplary Embodiment

In the first embodiment described above, two separate lids are provided for the coolant system and the electrical system, respectively. However, the present invention is not limited to such a structure. An immersion cooling apparatus in which a single lid is shared for both coolant and electrical systems may obtain advantageous effects similar to those in the first embodiment. More specifically, the surrounding space of the electronic circuit board placed in the pressure vessel is filled with flowing coolant, allowing efficient cooling. Also, the electronic circuit board is surrounded by the pressure vessel and the coolant, allowing enhanced resistance to harsh environments such as substantial vibrations and the outer space. In addition, the detachable lid can be removed to facilitate circuit board installation.

As a second embodiment of the present invention, an immersion cooling apparatus in which a single lid is shared for both coolant and electrical systems is described below with reference to FIGS. 9 and 10. For simplifying explanation, the same components as in the first embodiment are labeled with the same reference numerals.

Figure 9:
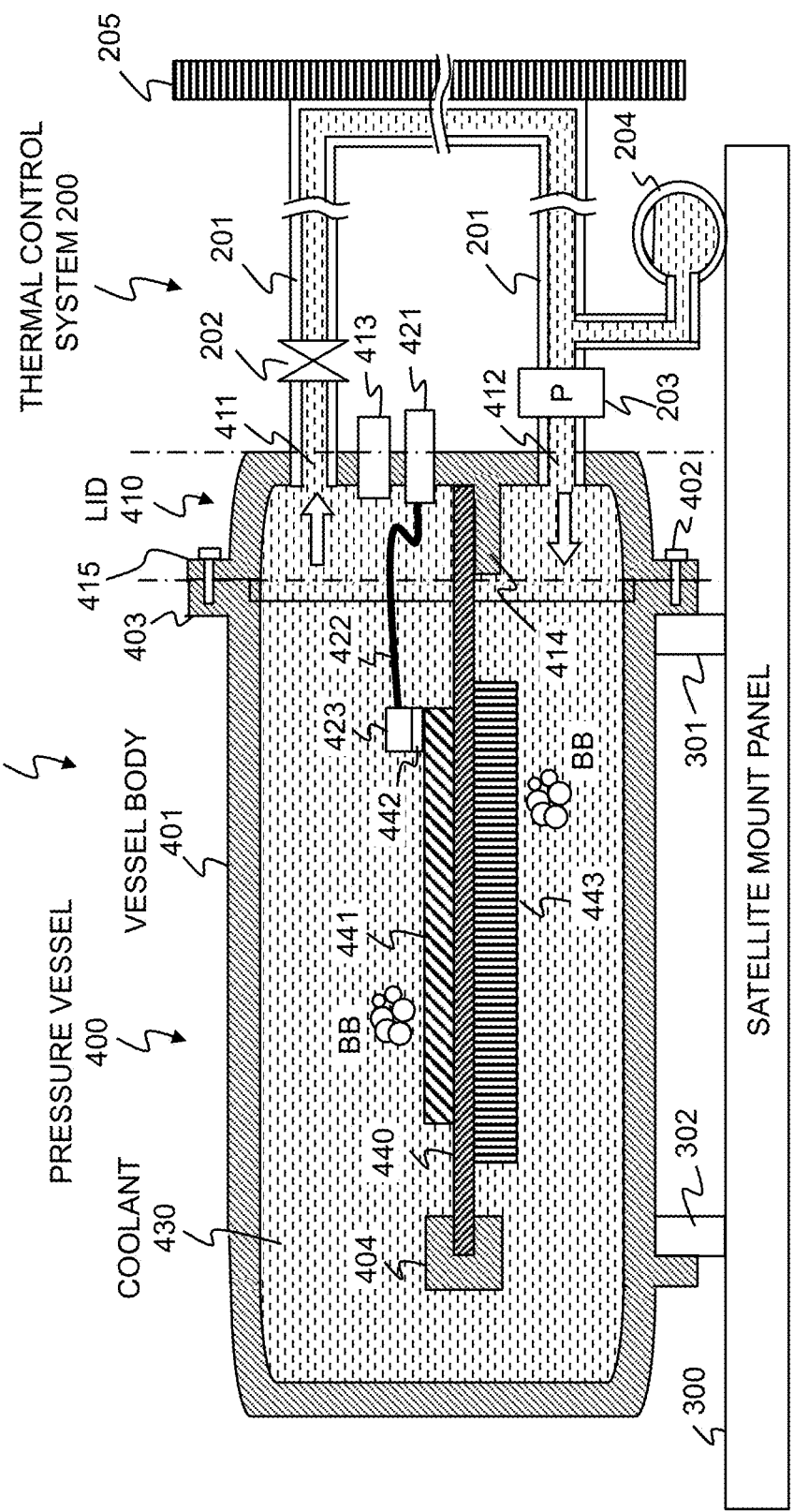
FIG. 9 illustrates a schematic side cross-sectional view of an immersion cooling apparatus according to a second embodiment of the present invention.
Figure 10:
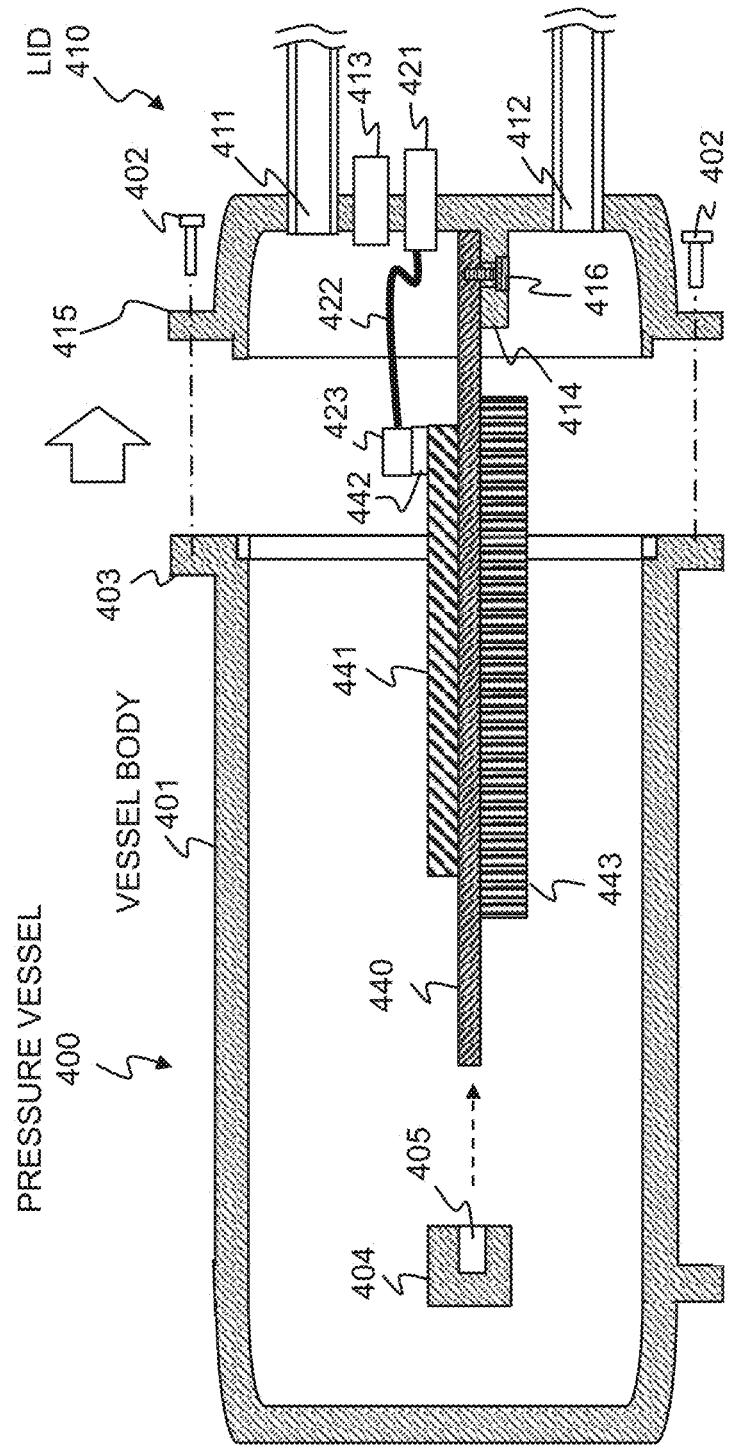
FIG. 10 illustrates an exploded side cross-sectional view for explaining the structure of the pressure vessel of the immersion cooling apparatus according to the second embodiment.

As illustrated in FIGS. 9 and 10, an immersion cooling apparatus 40 according to the second embodiment of the invention comprises a pressure vessel 400 and a thermal control system 200. The pressure vessel 400 comprises a cylindrical vessel body 401 with only one opening and a detachable lid 410 provided at the opening of the vessel body 401. The pressure vessel 400 seals in coolant 430. The lid 410 is hermetically joined to the vessel body 401 by a plurality of bolts 402 or other joining members.

The opening of the vessel body 401 has a flange 403 protruding outward from the opening end of the vessel body 101. The flange 403 is used to join the lid 410 to the vessel body 101. A support member 404 having a slot 405 is provided inside the vessel body 401 such that a plate 440 described below is supported at one end thereof by the end portion of the plate 440 fitting into the slot 405 of the support member 404.

The lid 410 has a coolant outlet 411 and a coolant inlet 412. The coolant 130 flows out through the coolant outlet 411. Coolant 130 that has been temperature-controlled by the thermal control system 200 flows in through the coolant inlet 412. Furthermore, sensors 413 for detecting the pressure and temperature in the pressure vessel 400 are provided at a position closer to the coolant outlet 411 between the coolant outlet 411 and the coolant inlet 412. The lid 410 has hermetic terminals 421 at the approximately central portion of the lid 410. The hermetic terminals 421 are electrical terminals for sending and receiving signals to and from the outside and for receiving power supply. The hermetic terminals 421 are connected to a connector 423 through a cable 422 in the coolant 430 and the connector 423 is connected to a connector 442 mounted on a circuit board 441.

The lid 410 also has a flange 414 protruding inward at a position between the pressure and temperature sensors 413 and the coolant inlet 412 such that the plate 440 is supported by the support member 404 at one end of the plate 440 and is fixed by the flange 414 at the other end of the plate 440. The flange 414 and the plate 440 are combined to form a partition wall that partitions the inside of the pressure vessel 400 on the side of the lid 410 vertically (in the top-and-bottom direction of FIG. 9). Accordingly, the flange 414 and the plate 440 as the partition wall prevents the coolant 430 from directly flowing from the coolant inlet 412 to the pressure and temperature sensors 413 and the coolant outlet 411. The lid 410 has a flange 415 protruding outward from the opening end of the lid 410. The flange 415 is used to join the lid 410 to the flange 403 of the vessel body 401 by joining members 402 (see FIG. 10).

As described above, the plate 440 is supported and fixed at both ends in the pressure vessel 400 by the support member 404 and the flange 414. The circuit board 441 is fixed to the surface of the plate 440 on the side of the coolant outlet 411. Heat-dissipating fins 443 are fixed to the surface of the plate 440 on the side of the coolant inlet 412. The connector 442 is provided at the end of the circuit board 441 on the side of the lid 410. As described above, the connector 442 is connected to the hermetic terminals 421 through the connector 423 and the cable 422, allowing signal transmission and power supply between the circuit board 441 and the outside.

The thermal control system 200 has a pipe arrangement 201 joined with the coolant outlet 411 and the coolant inlet 412. Since the thermal control system 200 has the same structure and functions as those of the first exemplary embodiment shown in FIG. 1, similar members and components are denoted by the same reference numerals and their explanations will be omitted.

As illustrated in FIG. 10, the plate 440 is fixed at one end to the mounting flange 414 of lid 410 by tap bolts 416. The mounting flange 414 has clearance holes through which the tap bolts 416 pass, allowing for visual inspection when tightening the tap bolts 416 to mount the plate 440 to the mounting flange 414, and facilitating work when attaching the tap bolts 416. In this way, the plate 440 mounted with the circuit board 441 and the heat dissipating fins 443 can be fixed to the mounting flange 414 of the lid 410 at one end of the plate 440.

In an assembly process, the circuit board 441 and the heat dissipating fins 443 are fixed on the plate 440 and then the plate 440 is fixed to the mounting flange 414 of the lid 410 at one end of the plate 440. Subsequently, as shown in FIG. 10, the vessel body 401 is moved in the direction shown by an arrow to accommodate the plate 440 mounted with the circuit board 441 and the heat dissipating fins 443. At that time, the plate 440 fits in the slot 405 of the support member 404 at the other end of the plate 440, so that the plate 440 is secured at both ends of the plate 440 in the pressure vessel 400. Finally, the joining member 402 is used to hermetically join the vessel body 401 to the lid 410 and then the coolant 430 is introduced into the pressure vessel 400. Note that guide members (not shown) may be provided at regular intervals on the inner side wall of the vessel body 401 so that the plate 440 is guided toward the slot 405 of the support member 404 and is finally inserted into the slot 405.

As described above, according to the present embodiment, the circuit board 441 is immersed in the coolant 430 flowing through the pressure vessel 400, which allows for efficient cooling. The circuit board 441 is surrounded by the pressure vessel 400 and the coolant 430, enhancing the resistance to substantial vibrations and harsh environments such as the outer space.

In the present embodiment, the pressure vessel 400 has the vessel body 401 and the lid 410 which can be separated. With the lid 410 removed, the plate 440 mounted with the circuit board 441 can be easily attached to the mounting flange 414 of the lid 410. Subsequently, the vessel body 401 is joined with the lid 410 so that the plate 440 mounted with the circuit board 441 is inserted into the vessel body 401. In this way, the circuit board 441 is sealed in the pressure vessel 400.

For the support rigidity of the circuit board 441 mounted in the pressure vessel 400, the plate 440 mounted with the circuit board 41 is fixed at both ends by the support member 404 of the vessel body 401 and the mounting flange 414 of the lid 410, respectively. This ensures the support rigidity that meets resistance requirements to substantial vibrations such as during rocket launches.

3. Coolant Filling

In the first and second exemplary embodiments as described above, after the pressure vessel (100, 400) has been assembled, the pressure vessel must be filled with coolant. The filling procedure of the coolant will be described below, taking the pressure vessel 100 in the first exemplary embodiment as an example. The same filling procedure may be used for the pressure vessel 400 in the second exemplary embodiment.

Figure 11:
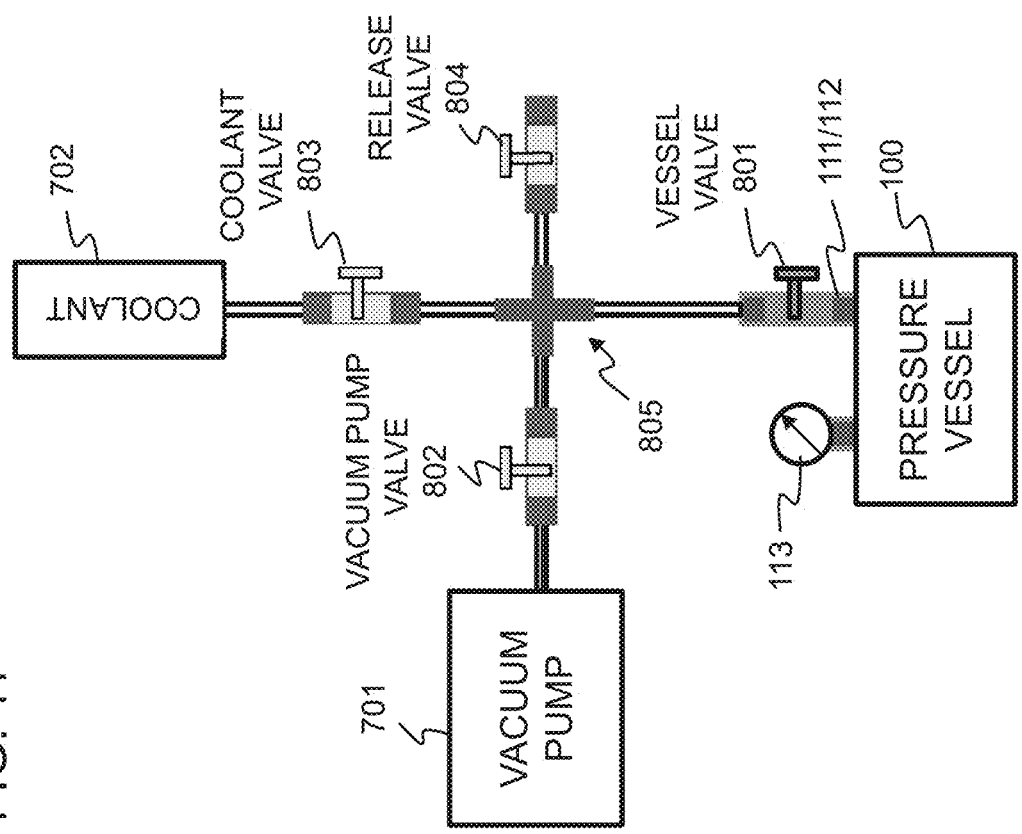
FIG. 11 illustrates a schematic diagram of a coolant filling arrangement for filling a pressure vessel with coolant.

In FIG. 11, the valve 202 at the coolant outlet 111 of the pressure vessel 100 is closed. A valve 801 is provided at the coolant inlet 112. Open/close valves 801-804 and pipe arrangement 805 can be used to selectively communicate among the pressure vessel 100, a vacuum pump 701, a coolant tank 702 and the outside.

First, weight measurement is performed in a state in which the pressure vessel 100 is emptied, that is, contains no coolant. Subsequently, in a state in which the coolant valve 803 and the release valve 804 are closed and the vessel valve 801 is opened, the vacuum pump 701 evacuates the pressure vessel 100 while monitoring the pressure in the pressure vessel.

When the evacuation is complete, the vacuum pump valve 802 is closed. Then, the coolant valve 803 is opened to pour coolant from the coolant tank 702 into the pressure vessel 100. Subsequently, the coolant valve 803 and the vessel valve 801 are closed and the release valve 804 is opened, thereby discharging coolant existing in the pipe arrangement 805. In this way, the amount of coolant contained in the pressure vessel 100 is estimated by weight measurement of the pressure vessel 100. If necessary, the vessel valve 801 is opened to discharge coolant from the pressure vessel 100 while monitoring the measured weight of the pressure vessel 100. The inner pressure of the pressure vessel 100 can be adjusted to fall into a predetermined range by connecting to the vacuum pump 701 and monitoring the pressure sensor.

When the coolant filling and the pressure adjustment are completed, the pressure vessel 100 is connected to the thermal control system 200 as shown in FIG. 1, and the pump 203 is driven to circulate the coolant to cool the circuit board 141 while performing thermal control by the thermal control system 200.

The invention is not limited to the exemplary embodiments described above, but can be modified in various ways without departing from the spirit or essential characteristics of the invention.

The invention is applicable to immersion cooling apparatuses used in harsh environments such as extremely cold/hot regions and the outer space.

The invention claimed is:
1. An immersion cooling apparatus for a circuit board including a heat-generating section, comprising:
   a pressure vessel including a vessel body and at least one lid, wherein the at least one lid is detachably joined to the vessel body, wherein a certain lid of the at least one lid has a coolant outlet and a coolant inlet, and wherein the pressure vessel is filled with liquid coolant; and
   a mounting member that places the circuit board at a position between the coolant outlet and the coolant inlet within the pressure vessel, wherein the circuit board is immersed in the liquid coolant within the pressure vessel such the circuit board is surrounded with the liquid coolant,
   wherein the circuit board is placed to partition an inside space of the pressure vessel into a coolant-outlet-side and a coolant-inlet-side, such that the liquid coolant forcedly flows from one side of the circuit board to outside the pressure vessel through the coolant outlet and forcedly flows into another side of the circuit board from outside the pressure vessel through the coolant inlet, wherein the vessel body has two opening surfaces which are detachably closed by a first lid and a second lid, respectively, wherein the first lid has the coolant outlet and the coolant inlet, and the second lid has electric terminals connected to the circuit board.

2. The immersion cooling apparatus according to claim 1, further comprising
a thermal control system that exchanges heat with the liquid coolant flowing out of the coolant outlet such that heat-exchanged liquid coolant flows into the coolant inlet, wherein the thermal control system includes a forced-liquid flow generator.

3. The immersion cooling apparatus according to claim 1, wherein the mounting member includes a first mounting member and a second mounting member which support the circuit board at both end portions thereof.

4. The immersion cooling apparatus according to claim 3, the vessel body has the first mounting member and the second mounting member.

5. The immersion cooling apparatus according to claim 3, wherein the vessel body has the first mounting member and the certain lid has the second mounting member.

6. The immersion cooling apparatus according to claim 1, wherein the vessel body is of cylindrical shape and has the two opening surfaces opposing each other.

7. The immersion cooling apparatus according to claim 1, wherein the mounting member comprises: a first mounting member protruding outward from one of the two opening surfaces; and a second mounting member protruding outward from another of the two opening surfaces,
and wherein the circuit board is fixed to the first mounting member and the second mounting member.

8. The immersion cooling apparatus according to claim 7, wherein the first lid has a protruding wall on an inner wall of the first lid at a position between the coolant outlet and the coolant inlet, and wherein the protruding wall and the first mounting member are combined to form a partition wall that partitions a first-lid-side inside space of the pressure vessel such that the partition wall prevents the liquid coolant from directly flowing from the coolant inlet to the coolant outlet.

9. A space vehicle equipped with the immersion cooling apparatus according to claim 1.

10. A method for cooling a circuit board including a heat-generating section, wherein the circuit board is placed within a pressure vessel including a vessel body and at least one lid, wherein the at least one lid is detachably joined to the vessel body,
wherein the circuit board is immersed in liquid coolant within the pressure vessel such the circuit board is surrounded with the liquid coolant, and wherein the vessel body has two opening surfaces which are detachably closed by a first lid and a second lid, respectively, wherein the first lid has the coolant outlet and the coolant inlet, and the second lid has electric terminals connected to the circuit board, the method comprising:
preparing a certain lid of the at least one lid having a coolant outlet and a coolant inlet;
placing the circuit board at a position between the coolant outlet and the coolant inlet to partition an inside space of the pressure vessel into a coolant-outlet-side and a coolant-inlet-side;
forcedly flowing the liquid coolant from one side of the circuit board to outside the pressure vessel through the coolant outlet; and
forcedly flowing the liquid coolant into another side of the circuit board from outside the pressure vessel through the coolant inlet.

11. The method according to claim 10, further comprising exchanging heat with the liquid coolant forcedly flowing out of the coolant outlet such that heat-exchanged liquid coolant forcedly flows into the coolant inlet.

* * * * *